United States Patent
Lee

(10) Patent No.: US 6,624,036 B2
(45) Date of Patent: Sep. 23, 2003

(54) TRANSISTOR IN SEMICONDUCTOR DEVICE AND METHOD OF MANUFACTURING THE SAME

(75) Inventor: Joo Hyoung Lee, Chungcheongbuk-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/026,958

(22) Filed: Dec. 27, 2001

(65) Prior Publication Data

US 2002/0195660 A1 Dec. 26, 2002

(30) Foreign Application Priority Data

Jun. 25, 2001 (KR) .................................... 2001-0036387

(51) Int. Cl.$^7$ ............................................ H01L 21/336
(52) U.S. Cl. ...................... 438/303; 438/300; 438/301; 438/304; 438/305
(58) Field of Search ................. 257/336, 344, 257/347, 348, 349, 388, 412, 408, 513; 438/149, 282, 298, 300, 301, 302, 303, 304, 305, 479, 517, 910

(56) References Cited

U.S. PATENT DOCUMENTS

| | | | | |
|---|---|---|---|---|
| 5,712,173 A | * | 1/1998 | Liu et al. | 438/297 |
| 5,908,313 A | * | 6/1999 | Chau et al. | 438/300 |
| 6,010,936 A | * | 1/2000 | Son | 438/303 |
| 6,071,783 A | * | 6/2000 | Liang et al. | 438/301 |
| 6,346,729 B1 | * | 2/2002 | Liang et al. | 257/344 |
| 6,380,053 B1 | * | 4/2002 | Komatsu | 438/517 |
| 6,417,054 B1 | * | 7/2002 | Zheng et al. | 438/300 |
| 6,483,158 B1 | * | 11/2002 | Lee | 257/408 |
| 6,489,650 B2 | * | 12/2002 | Kumazaki | 257/318 |

\* cited by examiner

Primary Examiner—Steven Loke
Assistant Examiner—Quang Vu
(74) Attorney, Agent, or Firm—Morgan, Lewis & Bockius LLP

(57) ABSTRACT

The present invention relates to a transistor in a semiconductor device and method of manufacturing the same. Therefore, the present invention can obtain an effect such as using a SOI substrate or a SIMOX substrate and can prevent a lowering in an electrical characteristic of the device, by using a bulk substrate made of a single crystal silicon but forming an insulating layer into which oxygen is injected below a LDD region.

9 Claims, 2 Drawing Sheets

TRANSISTOR IN SEMICONDUCTOR DEVICE AND METHOD OF MANUFACTURING THE SAME

BACKGROUND OF THE INVENTION

1. Field of the Invention

The invention relates generally to a transistor in a semiconductor device and a method of manufacturing the same, and more particularly to, a transistor in a semiconductor device and a method of manufacturing the same in which an oxygen ion implantation layer is formed below a LDD region.

2. Description of the Prior Art

Generally, as the integration level of semiconductor devices is higher, the size of a transistor is reduced. Also, as the size of the transistor is reduced, there occurs a problem that various electrical characteristics are degraded.

In order to solve this problem, the transistor is formed recently using a substrate having a SOI (silicon on insulator) structure in which a silicon layer is formed on an insulating film or a SIMOX (separation by implantation of oxygen) structure in which an oxygen layer is formed therein.

If this type of the substrate is used, however, the transistor maintains an electrically floating state with the substrate since it is formed over the insulating film or the oxygen layer. Due to this, a body effect by which the threshold voltage between a junction region and the substrate is changed, a King effect causing a punch through as holes are not discharged into the substrate but moved toward the junction region, and the like are generated to degrade reliability of the device.

In order to prevent this phenomenon, a contact hole through which the insulating film or the oxygen layer is penetrated is formed and a plug is formed therein, so that the transistor is not electrically floated. This method, however, requires additional complex process of forming the contact hole.

Also, as the integration level is higher, there is a problem that the junction leakage current is abruptly increased since silicide is penetrated deep into the substrate.

SUMMARY OF THE INVENTION

It is therefore an object of the present invention to provide a transistor in a semiconductor device and method of manufacturing the same, in which a bulk substrate made of a single crystal silicon is used but an insulating layer into which oxygen is injected is formed below a LDD region, thus obtaining the same effect such as using a substrate of a SOI structure or a SIMOX structure and preventing a lowering in an electrical characteristic and an increase in the junction leakage current depending on higher integration of a device.

In order to accomplish the above object, a transistor in a semiconductor device according to the present invention is characterized in that it comprises a semiconductor substrate in which a device isolation film of a trench structure is formed, a gate electrode formed on the semiconductor substrate in a channel region and electrically separated from the semiconductor substrate by a gate insulating film, and a junction region of a LDD structure in the semiconductor substrate on both sides of the gate electrode, wherein the transistor further comprising an insulating layer in which ions are injected below the LDD region in the junction region.

Also, a method of manufacturing a transistor in a semiconductor device according to the present invention is characterized in that it comprises the steps of injecting, by a given depth, ions into an active region in a semiconductor substrate in which a device isolation film is formed to form an insulating layer; forming a gate insulating film and a gate electrode on the semiconductor substrate in the channel region; forming a LDD region in the semiconductor substrate on the LDD region; forming an insulating film on the entire structure, forming an insulating film spatter on sidewalls of the gate electrode and performing an etch process so that the LDD region and the insulating layer are etched to form a groove at the side of the spacer; growing an epitaxial silicon layer in the groove and injecting impurity ions into the epitaxial silicon layer to form a junction region of a LDD structure; and forming a silicide layer on the surface of the gate electrode and the junction region.

The semiconductor substrate is a single crystal silicon substrate manufactured using Czochralski method, the ions is oxygen and the insulating layer is formed in thickness of 500~1000 Å from the surface of the semiconductor substrate.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

FIGS. 1~7 are cross-sectional views for explaining a method of manufacturing a transistor in a semiconductor device according to the present invention.

Figure 1:
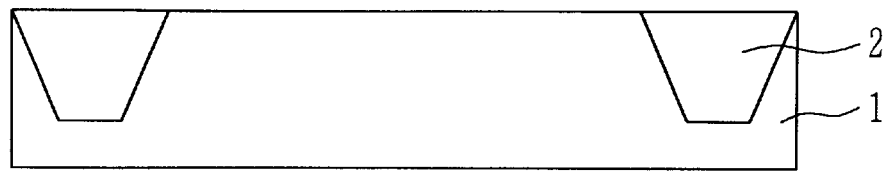
FIGS. 1~7 are cross-sectional views for explaining a method of manufacturing a transistor in a semiconductor device according to the present invention.

Referring now to FIG. 1, there is shown a device isolation film 2 of a trench structure formed in a device isolation region of a semiconductor substrate 1. The semiconductor substrate 1 uses a bulk-type single crystal silicon substrate manufactured using Czochralski method.

Figure 2:
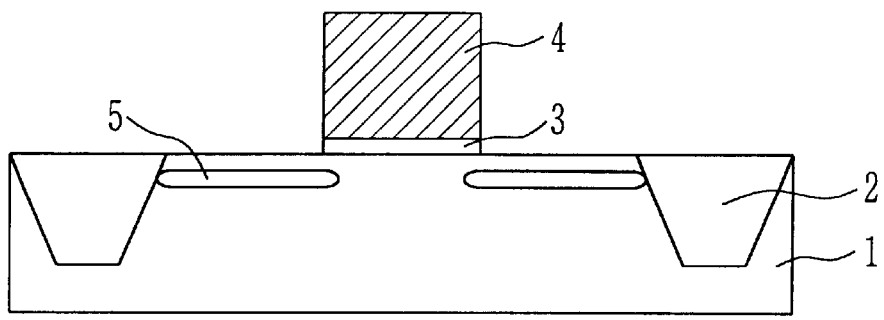

FIG. 2 is a cross-sectional view of the transistor in the semiconductor device in which for example, oxygen ions are injected into the semiconductor substrate 1 in the active region by a given depth to form an insulating layer 5. A gate insulating film 3 and a gate electrode 4 are then formed on the semiconductor substrate 1 in a channel region. The insulating layer 5 has a SIMOX structure into which oxygen ions are injected and is formed at the depth of 500~1000 Å from the surface of the semiconductor substrate 1.

Also, after the insulating layer 5 is formed, a high temperature annealing process is performed, so that metallic impurity (Cu, Ni, Fe, etc.), crystal defects, etc. existing on the surface of the substrate 1 can be captured by the insulating layer 5. Due to this, the flow of the leakage current can be reduced when the device is driven and the performance of the device can be improved.

Figure 3:
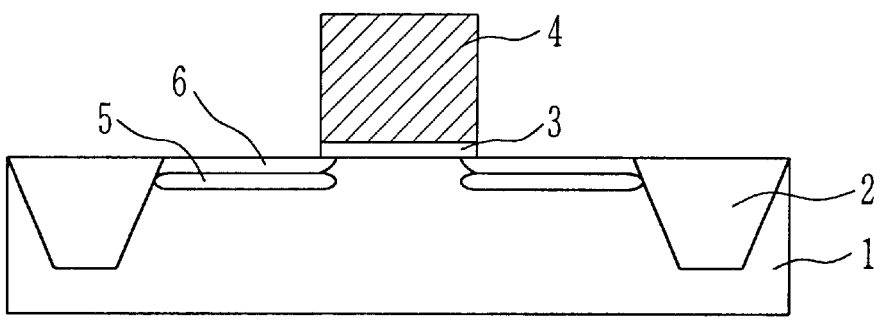

FIG. 3 is a cross-sectional view of the transistor in the semiconductor device in which LDD ions are injected into the semiconductor substrate 1 on the insulating layer 5 to form a LDD region 6.

Figure 4:
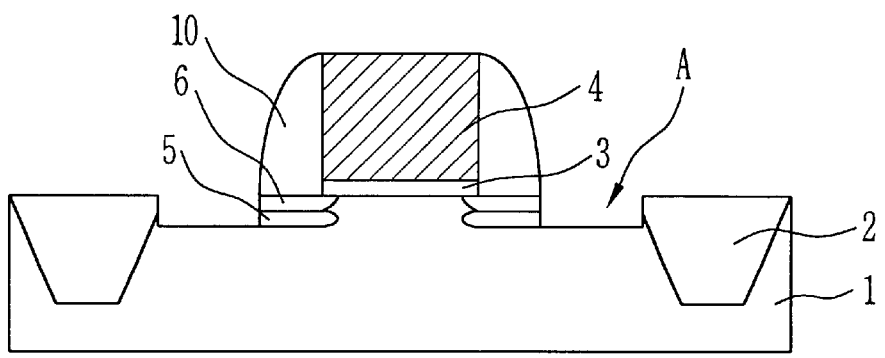

FIG. 4 is a cross-sectional view of the transistor in the semiconductor device in which an insulating film is formed on the entire structure and is then blanket-etched to form a spacer 10 on the sidewalls of a gate electrode 4. The LDD region 6 and the insulating layer 5 in the exposed portion are experienced by the etching process to form a groove A at the sides of the spacer 10.

Figure 5:
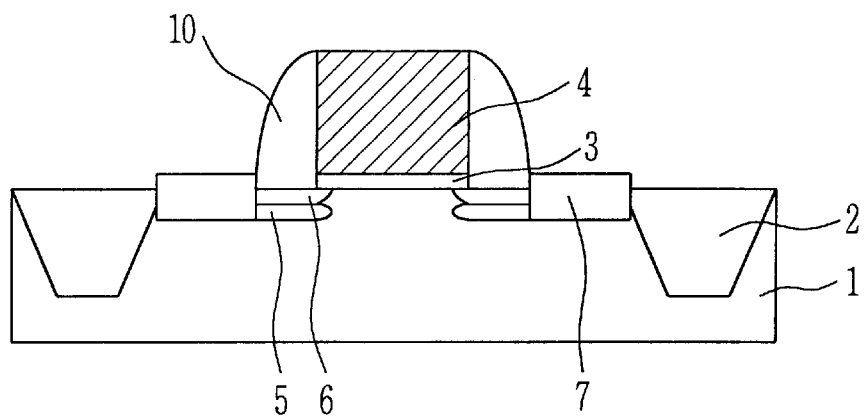
Figure 6:
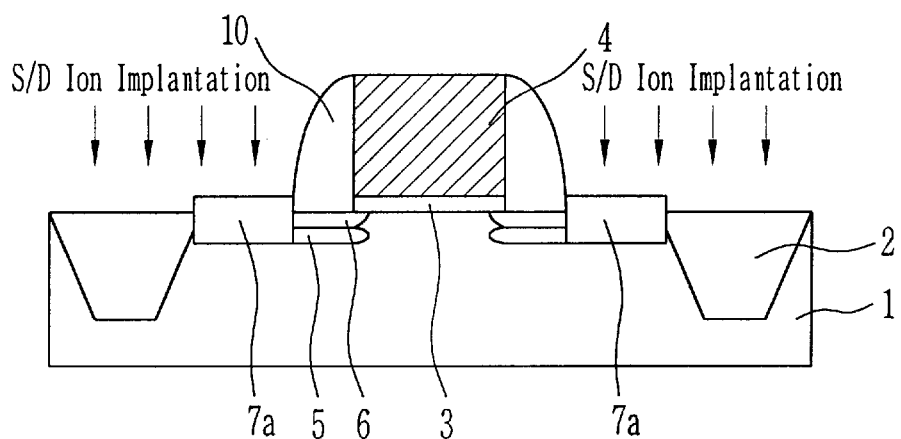

FIG. 5 is a cross-sectional view of the transistor in the semiconductor device in which the exposed semiconductor substrate 1 is grown by selective epitaxial growth method to form an epitaxial silicon layer 7 in the groove A. FIG. 6 is a cross-sectional view of the transistor in the semiconductor device in which impurity ions are injected into the epitaxial silicon layer 7 to form a junction region 7a. The epitaxial silicon layer 7 is grown to be higher 200~500 Å than the device isolation film 2.

Figure 7:
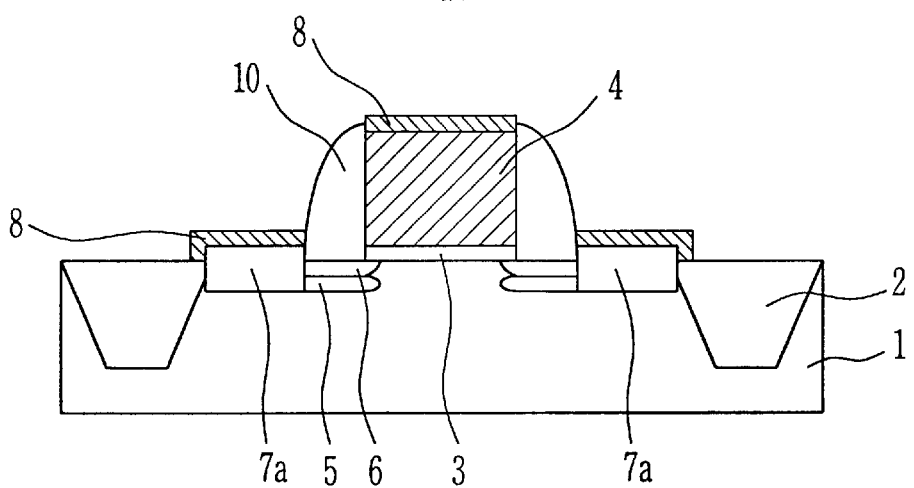

FIG. 7 is a cross-sectional view of the transistor in the semiconductor device in which a silicide layer 8 is formed on the surface of the gate electrode 4 and the junction region 7a. As in FIG. 5, the epitaxial silicon layer 7 is grown to be higher than the device isolation film 2. Therefore, there occurs no any loss in an upper interface of the device isolation film 2 and the silicide layer does not grow through the interface.

As can be understood from the above description, the present invention can obtain an effect such as using a SOI substrate or a SIMOX substrate and can prevent a lowering in an electrical characteristic of the device, by using a bulk substrate made of a single crystal silicon but forming an insulating layer into which oxygen is injected below a LDD region.

In other words, the present invention has advantages that it can prevent a body effect or a kink effect generated when the SOI or SIMOX substrate is used by maintaining the device to be floated with the substrate by portions other than the insulating layer into which oxygen ions are injected, and can prevent generation of a short channel effect by precluding a side diffusion of a junction ion by means of the insulating layer formed below the LDD region.

Further, the present invention can prevent generation of a leakage current depending on penetration of silicide by growing an epitaxial silicon layer used as a junction region to be higher than a device isolation film to prevent damage of the interface of the device isolation film.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a transistor in a semiconductor device, comprising the steps of:

injecting, by a given depth, ions into an active region in a semiconductor substrate to form an insulating layer;

forming a gate insulating film and a gate electrode in a channel region of said semiconductor substrate;

forming a LDD region in said semiconductor substrate on said insulating layer;

depositing an insulating material on the LDD region to form an insulating film spacer on a sidewall of said gate electrode;

performing an etch process so that said LDD region and said insulating layer are etched to form a groove at a side of said spacer;

growing an epitaxial silicon layer in said groove and injecting impurity ions into said epitaxial silicon layer to form a junction region; and forming a silicide layer on the surface of each of said gate electrode and said junction region.

2. The method as claimed in claim 1, wherein said semiconductor substrate is a bulk-type single crystal silicon substrate manufactured using a Czochralski method.

3. The method as claimed in claim 1, wherein said ions are oxygen.

4. The method as claimed in claim 1, wherein said insulating layer is formed at a depth of 500 Å~1000 Å from a surface of said semiconductor substrate.

5. The method as claimed in claim 1, wherein said epitaxial silicon layer is formed to be 200 Å~500 Å higher than a device isolation film formed in said semiconductor substrate.

6. The method as claimed in claim 1, wherein the step of forming said insulating layer further includes a high temperature annealing process so that metallic impurity existing on a surface of said semiconductor substrate can be captured by said insulating film.

7. The method as claimed in claim 1, further comprising the step of forming a device isolation film of a trench structure in a device isolation region of said semiconductor substrate.

8. The method as claimed in claim 1, wherein oxygen is injected into the insulating layer below the LDD region.

9. The method as claimed in claim 1, wherein said spacer is formed by a blanket etch process.

* * * * *